United States Patent
Kalnitsky et al.

(10) Patent No.: US 9,601,411 B2
(45) Date of Patent: Mar. 21, 2017

(54) SEMICONDUCTOR STRUCTURE

(71) Applicant: TAIWAN SEMICONDUCTOR MANUFACTURING CO., LTD., Hsinchu (TW)

(72) Inventors: Alexander Kalnitsky, San Francisco, CA (US); Hsiao-Chin Tuan, JuDong Township (TW); Shih-Fen Huang, Jhubei (TW); Hsin-Li Cheng, Jubei (TW); Felix Ying-Kit Tsui, Cupertino, CA (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/963,235

(22) Filed: Dec. 8, 2015

(65) Prior Publication Data
US 2016/0104660 A1 Apr. 14, 2016

Related U.S. Application Data

(62) Division of application No. 14/262,582, filed on Apr. 25, 2014, now Pat. No. 9,236,326.

(51) Int. Cl.
*H01L 29/74* (2006.01)
*H01L 31/111* (2006.01)
*H01L 23/48* (2006.01)
*H01L 21/768* (2006.01)
*H01L 23/528* (2006.01)

(52) U.S. Cl.
CPC ...... *H01L 23/481* (2013.01); *H01L 21/76898* (2013.01); *H01L 23/528* (2013.01); *H01L 2924/0002* (2013.01)

(58) Field of Classification Search
CPC ............... H01L 21/0228; H01L 21/241; H01L 21/28556; H01L 21/041; H01L 21/0455;
(Continued)

(56) References Cited

U.S. PATENT DOCUMENTS 4,549,927 A 10/1985 Goth et al.
5,102,817 A 4/1992 Chatterjee et al.
(Continued)

FOREIGN PATENT DOCUMENTS

JP 2012-216812 A 11/2012
TW 201401507 A 1/2014

*Primary Examiner* — David Nhu
(74) *Attorney, Agent, or Firm* — Maschoff Brennan

(57) ABSTRACT

A semiconductor structure and a method for fabricating the same are provided. The semiconductor structure includes a wafer substrate having a top surface and a bottom surface, and a conductive pillar in the wafer substrate defined by a deep trench insulator through the top surface and the bottom surface of the wafer substrate. The method for fabricating the semiconductor structure includes following steps. A deep trench is formed from a top surface of a wafer substrate to define a conductive region in the wafer substrate. The conductive region is doped with a dopant. The deep trench is filled with an insulation material to form a deep trench insulator. And the wafer substrate is thinned from a bottom surface of the wafer substrate to expose the deep trench insulator and isolate the conductive region to form a conductive pillar.

20 Claims, 10 Drawing Sheets

(58) Field of Classification Search
CPC ......... H01L 21/02175; H01L 21/02332; H01L 21/02642; H01L 21/3212; H01L 21/3148; H01L 21/2807; H01L 21/02271; H01L 21/67063; H01L 21/76877; H01L 21/76831; H01L 21/76224; H01L 21/76898; H01L 23/481
USPC ... 257/396, 61, 69, 148, 288, 336, 347, 375, 257/519, 549, E21.006, E21.007, 257/E21.042, E21.043, E21.056, 257/E21.077, E21.126, E21.127, E21.17, 257/E21.218, E21.229, E21.278, 257/E21.293, E21.304, E21.311, 257/E21.435, E21.545, E21.547
See application file for complete search history.

(56) References Cited

U.S. PATENT DOCUMENTS

| | | | |
|---|---|---|---|
| 6,034,389 A | | 3/2000 | Burns, Jr. et al. |
| 6,534,802 B1 | | 3/2003 | Schuegraf |
| 7,224,035 B1 | | 5/2007 | Skidmore et al. |
| 7,372,102 B2 | | 5/2008 | Chang et al. |
| 7,667,270 B2 | * | 2/2010 | Moens ................ H01L 21/3081 257/343 |
| 8,188,543 B2 | | 5/2012 | Roggenbauer et al. |
| 8,299,554 B2 | | 10/2012 | Adkisson et al. |
| 8,614,107 B2 | | 12/2013 | Lavoie et al. |
| 8,796,136 B2 | | 8/2014 | Sugiyama et al. |
| 8,927,427 B2 | * | 1/2015 | Graves-Abe ...... H01L 21/76898 257/621 |
| 8,981,466 B2 | * | 3/2015 | Grill ................. H01L 21/76283 257/330 |
| 9,236,326 B2 | * | 1/2016 | Kalnitsky ............ H01L 23/481 |
| 2008/0315368 A1 | | 12/2008 | MacNamara et al. |
| 2011/0248404 A1 | | 10/2011 | Chiu et al. |
| 2011/0275178 A1 | | 11/2011 | Trezza et al. |
| 2013/0313682 A1 | * | 11/2013 | Jebory ................. H01L 21/761 257/544 |

* cited by examiner

SEMICONDUCTOR STRUCTURE

RELATED APPLICATIONS

The present application is a Divisional Application of the application Ser. No. 14/262,582, filed Apr. 25, 2014, issued as U.S. Pat. No. 9,236,326 on Jan. 12, 2016.

BACKGROUND

The semiconductor industry has experienced rapid growth. The improvements in the density of various electronic components, such as transistors, diodes, resistors, capacitors, allows more components to be integrated into a given area. The number and lengths of interconnections also increase with the increasing density of the electronic components, so are circuit RC delay and power consumption. However, the volume of the integrated components is two dimensional (2D) in nature which is essentially on the surface of the semiconductor wafer. The density of the components on the wafer surface has physical limitation. To solve such limitations, three-dimensional integrated circuit (3D IC) with stacked dies may be introduced which promises the higher speed and density, smaller size, and multi-functional electronic devices.

By integrating multiple dies in a vertical direction, through-silicon vias (TSVs) may be used in such as the stacked dies to connect the dies with different functions and devices TSVs are vias that extend completely through the semiconductor wafer substrate to allow chip-to-chip interconnect schemes or wafer-to-wafer interconnect schemes compatible with 3D wafer-level packaging. The TSVs are filled with conductive material, and connective pads are formed on top and bottom of the conductive material. TSVs are also used to route signals from one surface of a die to the opposite surface, which provides a shorter interconnection distance in contrast with a 2D structure. TSVs are much larger than other standard cells in a design, and thus impact IC performance in a greater degree. Accordingly, improvements in TSVs continue to be sought.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
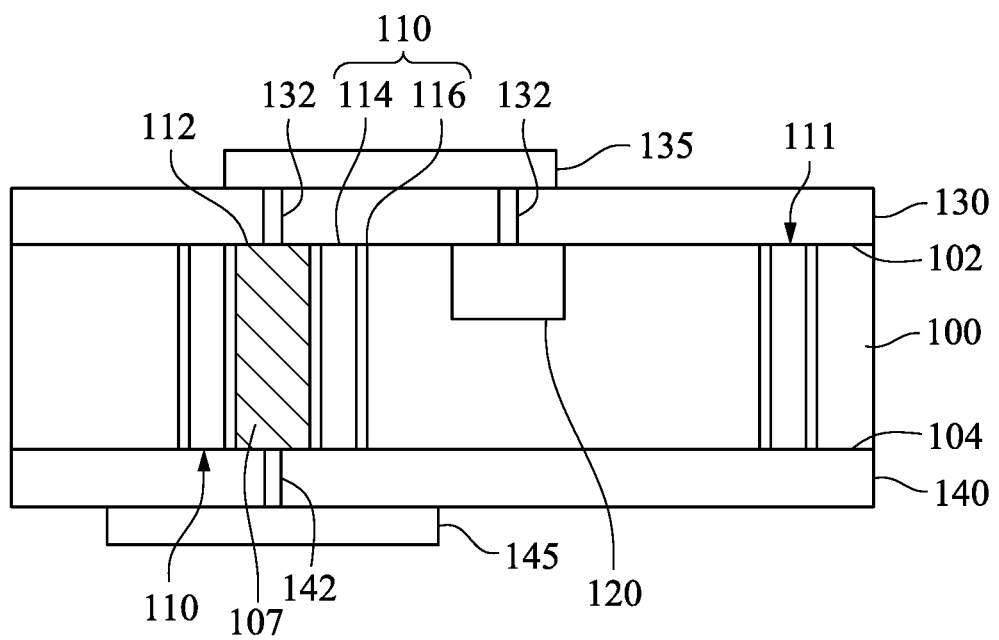
FIG. 1 is a cross-sectional view of the semiconductor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms "comprising," "including," "having," "containing," "involving," and the like are to be understood to be open-ended, i.e., to mean including but not limited to.

The singular forms "a," "an" and "the" used herein include plural referents unless the context clearly dictates otherwise. Therefore, reference to, for example, a dielectric layer includes embodiments having two or more such dielectric layers, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

TSVs are used in 3D IC technology. In some embodiments, TSVs are formed in a back end of line (BEOL) process, which starts after semiconductor devices, such as transistors, capacitors, and resistors, formed, and use the conductive material, for example, copper or tungsten, in the vias to electrically connect the top and bottom surface of the wafer. In the present disclosure, a mechanism of a semiconductor structure is provided. The fabricating method includes defining a conductive pillar in a wafer substrate by a deep trench insulator to form a TSVs structure. Because the conductive pillar is defined by the deep trench insulator, the TSVs in the present disclosure may form with different areas at the same time, in comparison with the TSVs formed by vias may only have the same area. The mechanism disclosed herein may form TSVs without copper and tungsten, therefore may save costs and simplify the process.

Further more, the fabrication method disclosed herein forms the TSVs in a front end of line (FEOL) process, forming the TSVs before the formation of the semiconductor devices.

Referring to FIG. 1, FIG. 1 is a cross-sectional view of the semiconductor structure, in accordance with some embodiments. Referring to FIG. 1, a wafer substrate 100 has a top surface 102 and a bottom surface 104. A conductive pillar 112 in the wafer substrate 100 defined by a deep trench insulator 110 through the top surface 102 and the bottom surface 104 of the wafer substrate 100. The conductive pillar 112 is electrically connected with the top surface 102 and the bottom surface 104 of the wafer substrate 100. The wafer substrate 100 may be a silicon wafer, silicon-germanium wafer, germanium wafer, or gallium-arsenide wafer. The wafer substrate 100 may be a lightly doped (P− or N−), moderately doped (P or N), highly doped (P+ or N+), or heavily doped (P++ or N++) wafer. In some embodiments, the wafer substrate 100 having an epi layer on the wafer substrate 100. The conductive pillar 112 includes a dopant. The dopant is selected from the group consisting of phosphorus, arsenic, boron, aluminum, gallium, and combinations thereof. A concentration of the dopant may depend on the requirements of the product. The deep trench insulator 110 includes a middle filler material 114 and an insulation layer 116 surrounding the filler material 114 and in contact with the wafer substrate 100 and the conductive pillar 112. The insulation layer 116 includes an insulation material. The insulation material may be an oxide or nitride material, for example, silicon oxide. The middle filler material 114 may be doped or non-doped polysilicon, silicon oxide, silicon nitride, or metals such as copper or tungsten. In some embodiments, the middle filler material and the insulation material in the deep trench insulator 110 may be the same, for example, silicon oxide. In some embodiments, the wafer substrate 100 have more than one deep trench insulator, for example, deep trench insulator 111.

According to various embodiments, the semiconductor structure further includes a plurality of semiconductor devices 120 on the top surface of the wafer substrate. The semiconductor devices 120 may include transistors, capacitors, resistors, or combinations thereof. The semiconductor devices 120, for example, are complementary metal-oxide semiconductors (CMOS). According to various embodiments, the semiconductor structure further includes a top interlayer dielectric (ILD) layer 130 over the top surface 102 of the wafer substrate 100; a top metal layer 135 over the top interlayer dielectric layer 130; and a plurality of top contact vias 132 contacting the top metal layer 135 in the top interlayer dielectric layer 130. The top metal layer 135 and the top contact vias 132 electrically connected to the conductive pillar 112. The semiconductor devices 120 are also electrically connect to the top metal layer 135. The top ILD layer 130 may include a low-K dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, silicon oxide, silicon nitride, and combinations thereof. The top metal layer 135 and the top contact vias 132 may include a copper-based or aluminum-based material. For example, the copper-based material include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium.

According to various embodiments, the semiconductor structure further includes a bottom interlayer dielectric layer 140 over the bottom surface 104 of the wafer substrate 100; a bottom metal layer 145 over the bottom interlayer dielectric layer 140; and a plurality of bottom contact vias 142 contacting the bottom metal layer 145 in the bottom interlayer dielectric layer 140. The bottom metal layer 145 and the bottom contact vias 142 electrically connected to the conductive pillar. The bottom ILD layer 140 may include the same material with the top ILD layer 130, for example, silicon oxide or BPSG. The bottom contact vias 142 and bottom metal layers 145 may include the same conductive material with the top metal layer 130, such as the copper-based material or aluminum-based material. In some embodiments, external contacts such as solder bumps are formed on the bottom metal layers 145.

Figure 2A:
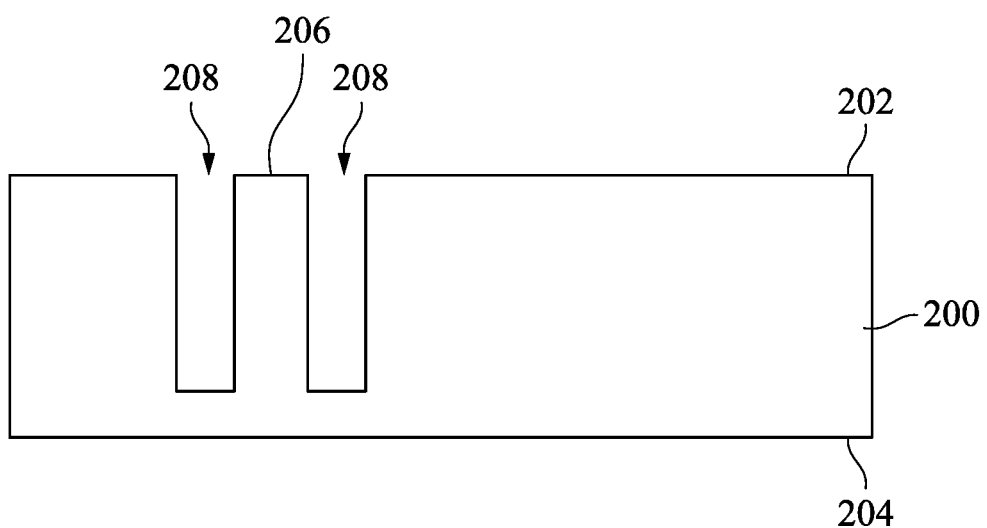
FIGS. 2A-2F are cross-sectional views at various stages of fabricating the semiconductor structure, in accordance with some embodiments.

Referring to FIGS. 2A-2F, FIGS. 2A-2F are cross-sectional views at various stages of fabricating the semiconductor structure, in accordance with some embodiments. Referring to FIG. 2A, a deep trench 208 is formed in a wafer substrate 200 from a top surface 202 of the wafer substrate 200. The wafer substrate 100 may be a silicon wafer, silicon-germanium wafer, germanium wafer, or gallium-arsenide wafer. The wafer substrate 200 may be a lightly doped (P− or N−), moderately doped (P or N), highly doped (P+ or N+), or heavily doped (P++ or N++) wafer. A conductive region 206 is defined by the deep trench 208 in the wafer substrate 200. The deep trench 208 has a pattern of circular ring, triangular ring, rectangular ring, or polygonal ring. The top view of the conductive region 206 may be a rectangle, triangle, circle, or a polygon defined by the deep trench 208. The conductive region 206 may become a conductive pillar to be electrical connected the top surface 202 and a bottom surface 204 of the wafer substrate 200. The process of forming the deep trench may include depositing a pad oxide and a hard mask over the top surface of the wafer substrate, patterning and etching to form deep trenches, and removing the hard mask and the pad oxide. The deep trench may be etched using any suitable etching method including, for example, plasma etch, a chemical wet etch, and/or other processes known in the art. In an embodiment, the etching process includes a deep reactive ion etching (RIE) process to etch the wafer substrate. In some embodiments, the depth of the deep trench is in a range from about 75 μm to about 150 μm.

Figure 2B:
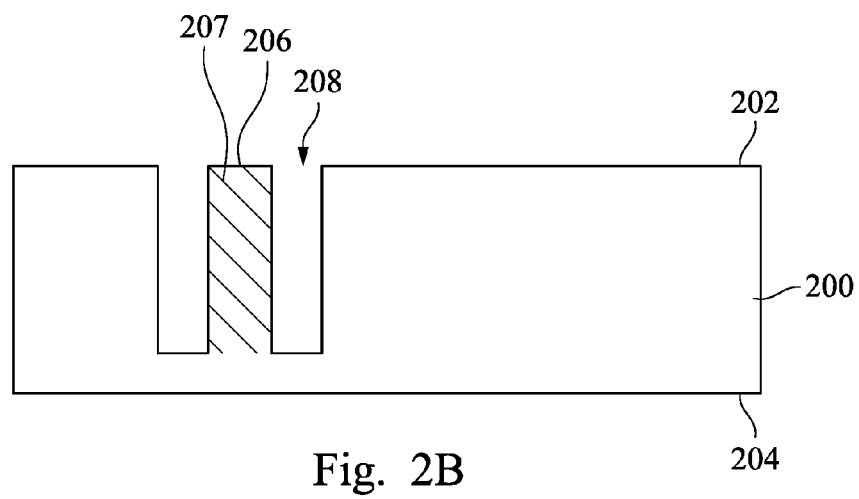

Referring to FIG. 2B, FIG. 2B is a stage of fabricating the semiconductor structure. The conductive region 206 is doped after the deep trench 208 is formed in the wafer substrate 200. A dopant 207 is doped into the conductive region 206. The dopant 207, depending on which type the wafer substrate is, may be phosphorus, arsenic, boron, aluminum, gallium, or combinations thereof. The dopant 207 may be doped by ion implanting or diffusion.

Figure 2C:
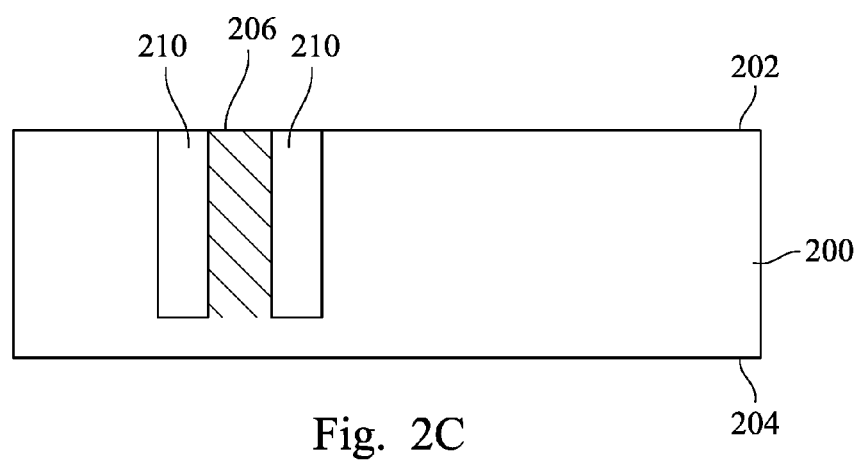

Referring to FIG. 2C, the deep trench insulator 210 is formed by filling the deep trench 208 with the insulation material. The insulation material may be an oxide or nitride material. In various embodiments of the present disclosure, the deep trench insulator is filled with the middle filler material such as polysilicon and an insulation layer including insulation material surrounding the middle filler material. The deep trench insulator is formed by deposition methods including thermal oxidation, low-pressure chemical vapor deposition (LPCVD), atmospheric-pressure chemical vapor deposition (APCVD), plasma-enhanced chemical vapor deposition (PECVD) and future-developed deposition procedures. The deposition process also includes a chemical mechanical polishing (CMP) process to remove the insulation material on the top surface.

Figure 2D:
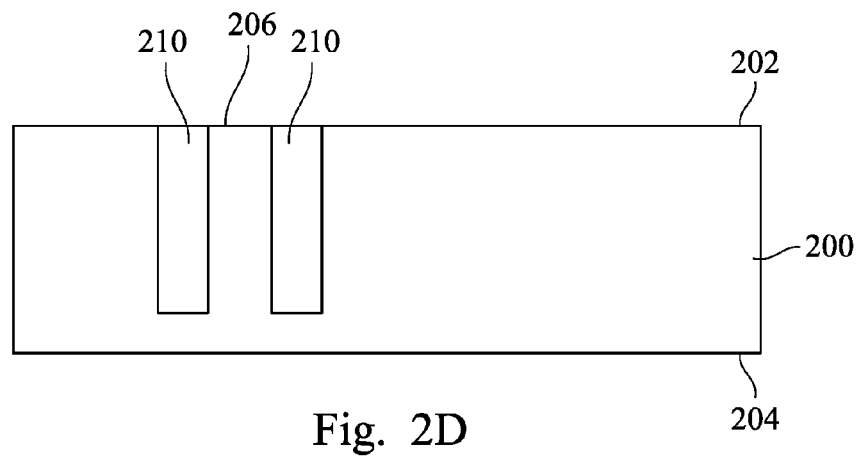
Figure 2E:
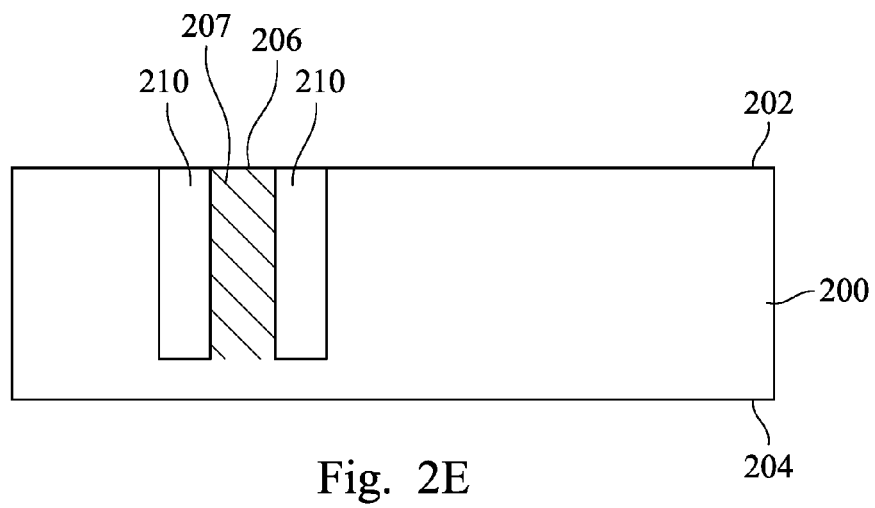

Referring to FIGS. 2D and 2E, FIGS. 2D and 2E show the fabricating process that the dopant doped after the formation of the deep trench insulator according to various embodiments. FIG. 2D is also a fabricating stage after FIG. 2A. A deep trench insulator 210 is formed by depositing the insulation material into the deep trench 208. The deposition method and the insulation material are the same with the method and material previously described. Referring to FIG. 2E, a dopant 207 is doped into the conductive region 206. The dopant 207 may be phosphorus, arsenic, boron, aluminum, gallium, or combinations thereof. The dopant 207 may be doped by ion implanting or diffusion. The concentration of the dopant may depend on the structure requirement.

Figure 2F:
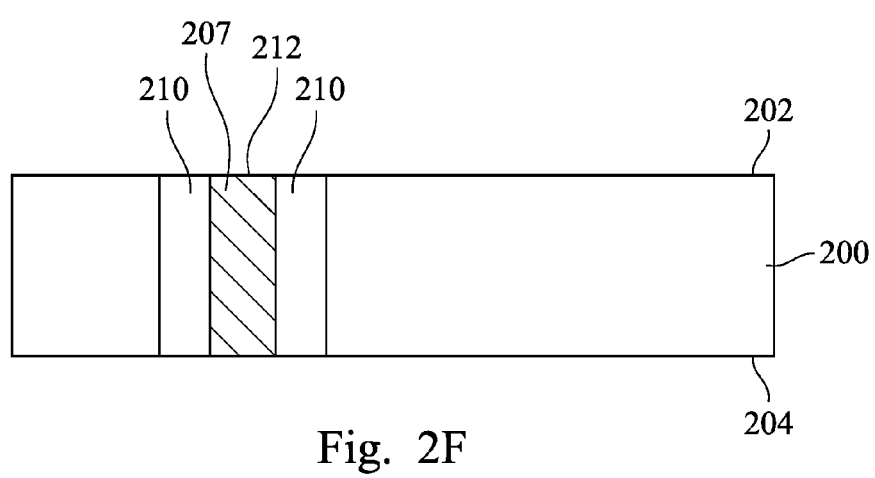

Referring to FIG. 2F, FIG. 2F is a stage of semiconductor structure fabricating process after FIG. 2C or FIG. 2E. The wafer substrate 200 is thinned from the bottom surface 204 of the wafer substrate 200 to expose the deep trench insulator 210 and isolate the conductive region 206 to form a conductive pillar 212. The conductive pillar 212 is used for electrical connected the top surface 202 and a bottom surface 204 of the wafer substrate 200. Therefore, a conductivity of the wafer substrate 200 and the dopant 207 concentration may affect the design of the conductive pillar 212. For example, the wafer substrate 200 may be a lightly doped wafer substrate or heavily doped wafer substrate. The higher the dopant 207 concentration in the conductive pillar 212, the smaller area the conductive pillar 212 may need to perform the same conductivity.

Figure 3A:
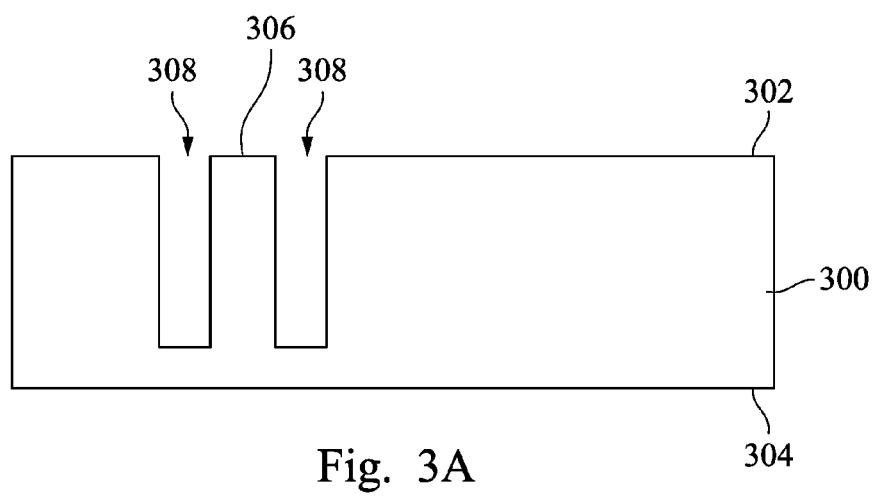
FIGS. 3A-3H are cross-sectional views at various stages of fabricating the semiconductor structure, in accordance with some embodiments.

Referring to FIGS. 3A-3H, FIGS. 3A-3H are cross-sectional views at various stages of fabricating the semiconductor structure, in accordance with some embodiments. Referring to FIG. 3A, a deep trench 308 is formed in a wafer substrate 300 from a top surface 302 of the wafer substrate 300. The wafer substrate 300 may be a silicon wafer. A conductive region 306 is defined by the deep trench 308 in the wafer substrate 300. The deep trench 308 may be etched using any suitable etching method including plasma etching, chemical wet etching, RIE, and/or other processes known in the art. In some embodiments, the depth of the deep trench 308 is in a range from about 75 μm to about 150 μm.

Figure 3B:
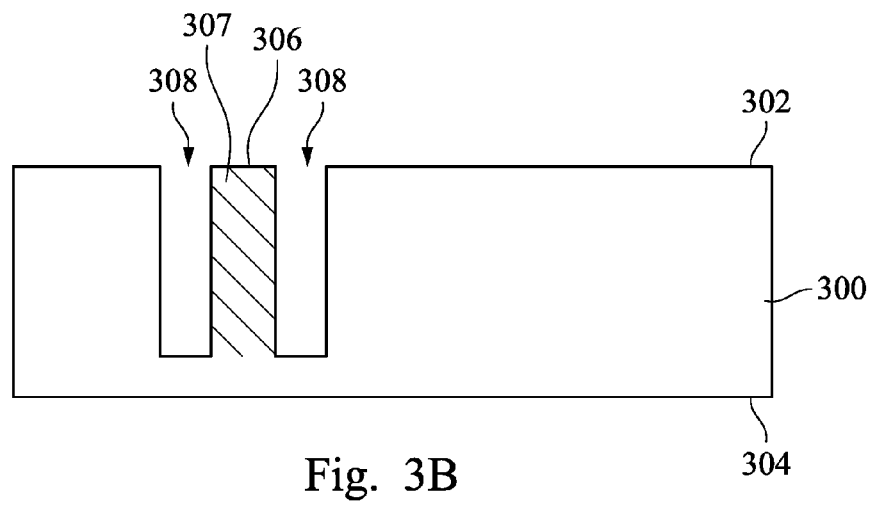

Referring to FIG. 3B, the conductive region 306 is doped with a dopant 307. The doping method may be diffusion or ion implantation; additional mask to define an implanting region may need in some embodiments. The dopant 307 may be phosphorus, arsenic, boron, aluminum, gallium, or combinations thereof. In some embodiments, the conductive region 306 may be doped after the formation of a deep trench insulator 310 or the formation of semiconductor devices 320.

Figure 3C:
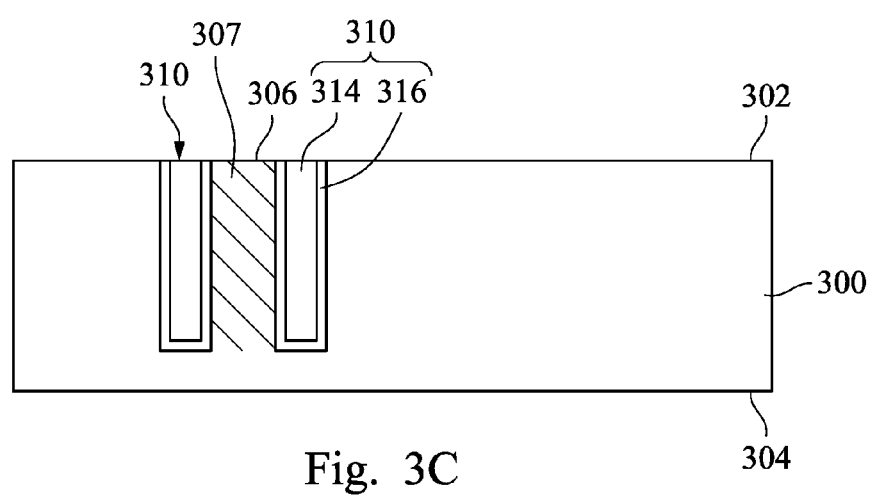

Referring to FIG. 3C, a deep trench insulator 310 is formed by filling the deep trench 308 with an insulation material. In various embodiments of the present disclosure, the deep trench insulator 310 have multilayer structure, in which an insulation layer 316 is deposited in the deep trench 308 and a middle filler layer 314 is deposited over the insulation layer 316. The insulation layer 316 includes insulation material such as silicon oxide or silicon nitride and isolates the middle filler layer 314 with the wafer substrate 300. The middle filler layer 314 may include filler material such as doped or non-doped polysilicon, silicon oxide, and silicon nitride, or metals such as copper or tungsten. The insulation layer 316 may be formed by thermal oxidation or LPCVD. The filler layer may be formed by LPCVD, APCVD, PECVD, PVD or any suitable methods. And a CMP process to remove the insulator material and filler material deposited on the top surface 302 of the wafer substrate 300. In some embodiments, an oxidation process is used to form an oxide layer on the deep trench insulator to protect the deep trench insulator 310.

Figure 3D:
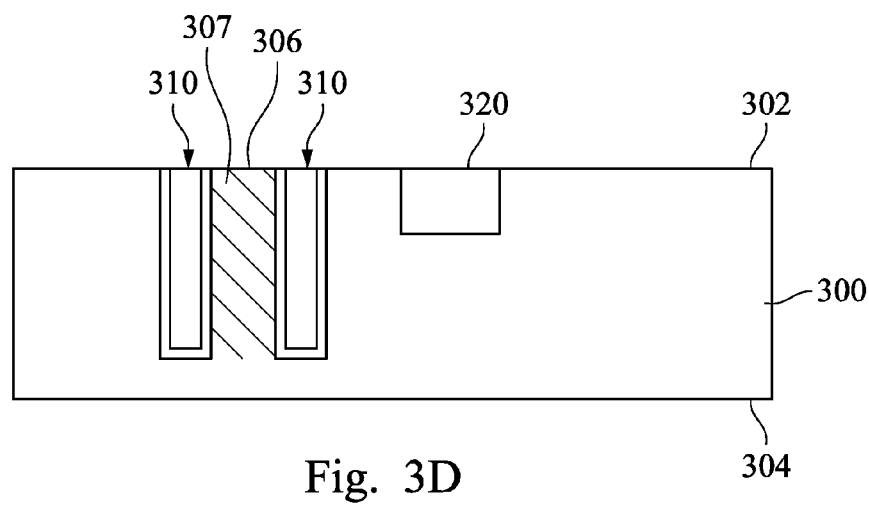

Referring to FIG. 3D, a plurality of semiconductor devices 320 are formed on the top surface 302 of the wafer substrate 300. Because the deep trench insulator 310 and conductive region 306 are formed before forming the semiconductor devices 320, the method of fabricating the semiconductor structure in the disclosure is a FEOL process. The semiconductor devices 320 may include transistors, capacitors, resistors, or combinations thereof. The operation of forming the semiconductor devices may include depositing, pattering, etching, doping, and any other operation known in the art.

Figure 3E:
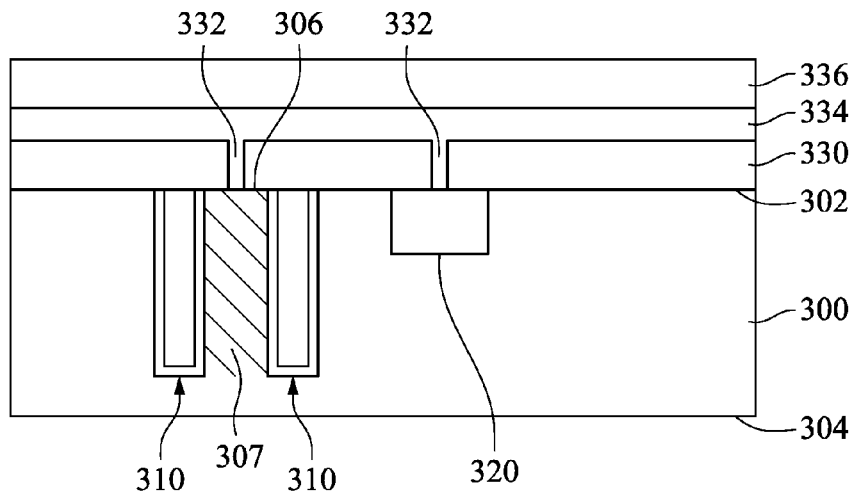
Figure 3F:
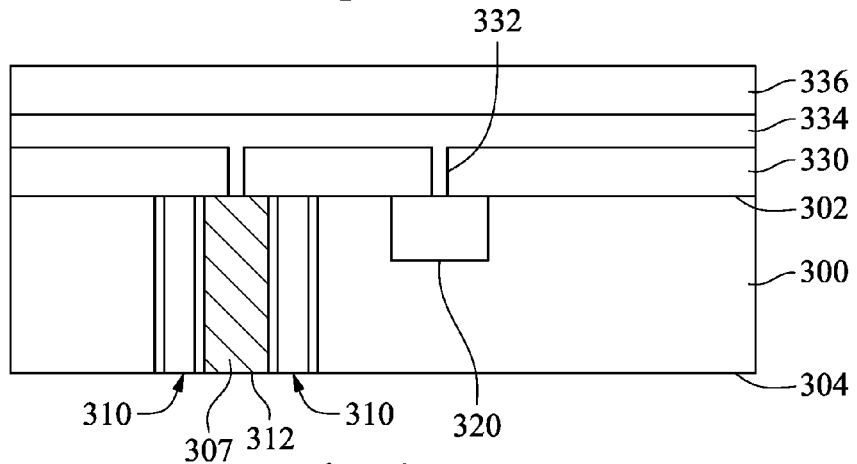
Figure 3G:
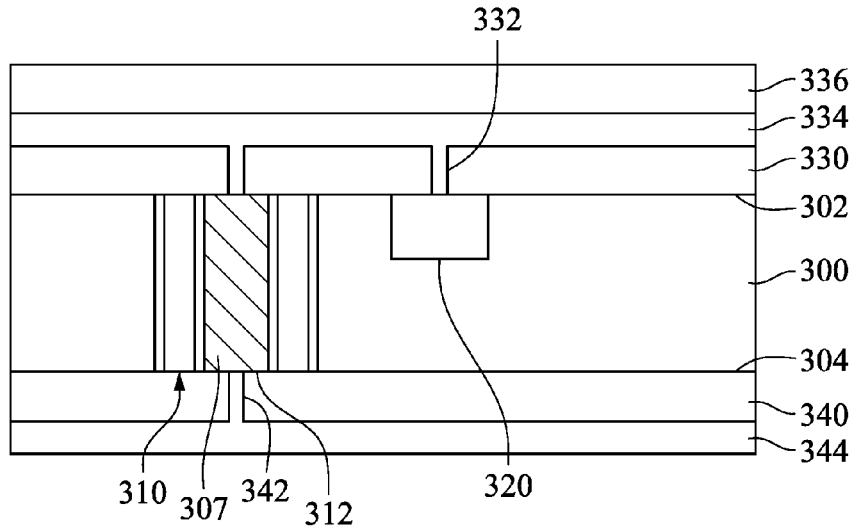

Referring to FIG. 3E-3G, after the semiconductor devices 320 are formed, the BEOL process are processed on the top surface 302 and bottom surface 304 of the wafer 300 to fabricate an interconnection structure including a plurality of interlayer dielectric layers, metal layers, and contact vias. Referring to FIG. 3E, an top interlayer dielectric (ILD) layer 330 is formed all over the top surface 302 of the wafer substrate 300; a plurality of top contact vias 332 are formed in the top interlayer dielectric layer 330; a top metal layer 334 is formed over the top ILD layer 330. The top contact vias 332 and the top metal layer 334 are electrically connected to the conductive region 306. In various embodiments of the present disclosure, a protection layer 336 is formed over the top metal layer 334. The top ILD layer 330 covers the semiconductor devices 320 and the deep trench insulators 310. The top ILD layer 330 may include a low-K dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, silicon oxide, silicon nitride, and combinations thereof. The top ILD layer 330 is formed by any suitable method known in the art, such as spinning, CVD, PECVD, or LPCVD. The top contact vias 332 and top metal layers 334 are formed by etching part of the top ILD layer 330 than depositing a copper-based or aluminum-based material. For example, the copper-based material include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. The top ILD layer 330, top contact vias 332 and top metal layers 334 may be a multilayer structure to form the interconnection structure. A contact via 332 is formed on the top surface 302 of the conductive region 312 and connects to the top metal layer 334. The semiconductor devices 320 are also electrically connect to the top metal layer 334. The protection layer 336 may be formed over the top metal layer 334 to protect the interconnection structure. The protection layer 336 may include silicon oxide and silicon nitride and is formed by deposition method such as CVD, PVD, or sputtering.

Referring to FIG. 3F, the wafer substrate 300 is thinned from the bottom surface of the wafer substrate 300, therefore, the deep trench insulator 310 is exposed and a conductive pillar 312 is formed. The wafer substrate 300 may be thinned by a grinding, etching, and/or polishing process to isolate the conductive region 306 to form the silicon pillar 312. The silicon pillar 312 is surrounded by the deep trench insulator 310 and is isolated with the wafer substrate 300. Therefore the conductive pillar 312 may electrically connect the top surface 302 and the bottom surface 304 of the wafer substrate 300.

Referring to FIG. 3G, a bottom interlayer dielectric (ILD) layer 340 is deposited over the bottom surface 304 of the wafer substrate 300; a plurality of bottom contact vias 342 are formed in the bottom interlayer dielectric layer 340; a bottom metal layer 344 is formed over the bottom ILD layer 340. The bottom contact vias 342 and the bottom metal layer 344 are electrically connected to the conductive pillar 312. The bottom ILD layer 340 may include the same material with the top ILD layer 330, for example, silicon oxide or BPSG. The bottom ILD layer 340 may be formed by any suitable method known in the art, such as spinning, PVD, CVD, PECVD, or LPCVD. The bottom contact vias 342 and bottom metal layers 344 are formed by etching part of the bottom ILD layer 340, than depositing a conductive material, such as the copper-based material or aluminum-based material. In some embodiments, external contacts such as solder bumps are formed on the bottom metal layers 344.

Figure 3H:
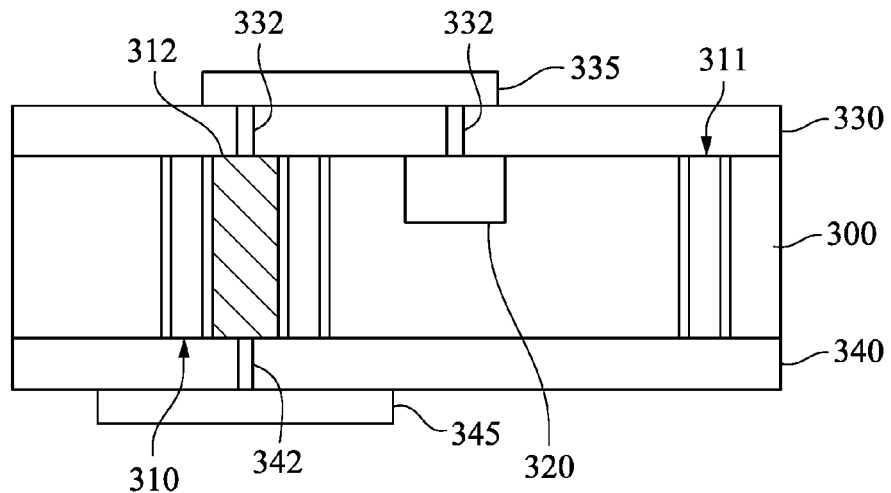

Referring to FIG. 3H, FIG. 3H shows a semiconductor structure according to various embodiments. The top metal layer 334 and bottom metal layer 344 in FIG. 3G may also be patterned to form the top metal layer 335 and bottom metal layer 345. And another deep trench insulator 311 may also be shown in the embodiment. The semiconductor fabricating method of the semiconductor structure may include forming a plurality of deep trench insulators in the wafer substrate before forming the semiconductor devices 332.

Figure 4A:
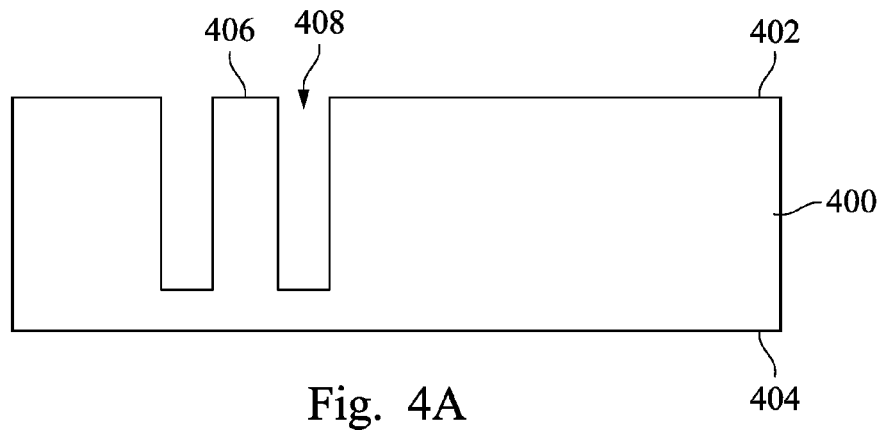
FIGS. 4A-4E are cross-sectional views at various stages of fabricating the semiconductor structure, in accordance with some embodiments.

Referring to FIGS. 4A-4E and 5A-5H, these figures shows embodiments of the above-mentioned fabricating method with different kinds of wafer substrates and doping methods. Referring to FIG. 4A, a deep trench 408 is formed from a top surface 402 of a wafer substrate 400. A conductive region 406 is defined by the deep trench 408 in the wafer substrate 400. The wafer substrate 400 may be a lightly doped P-type or N-type (P− or N−) silicon wafer. The deep trench 408 may be formed by RIE. In some embodiments, a hard mask layer is formed over the top surface 402 of the wafer substrate 400 to define the deep trench.

Figure 4B:
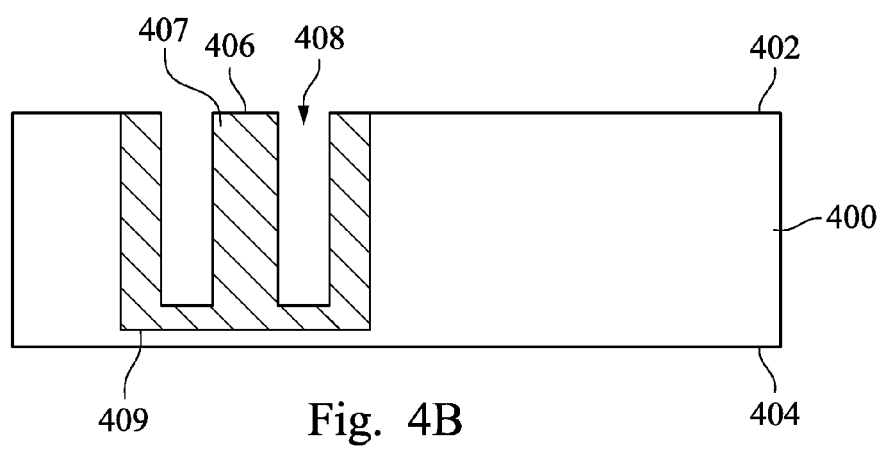

Referring to FIG. 4B, the conductive region 406 is doped with a dopant 407, and a doped region 409 is formed around the deep trench 408, in which the doped region 409 includes the dopant 407. The dopant is doped by diffusion from a sidewalls and a bottom surface of the deep trench 408 into the wafer substrate. The dopant 407 may diffuse into the conductive region 406 from the sidewall of the deep trench 408 into the middle of the conductive region 406, making the conductive region 406 having a dopant concentration which let the conductive region 406 become a conductor. The dopant 407 may also diffuse into the wafer substrate 400 from the sidewall and the bottom surface of the deep trench 408; therefore, the doped region 409 is formed. For example, the dopant concentration in the conductive region 406 is about $10^{19}$ to about $10^{21}$ atoms/cm$^3$. In various embodiments of the present disclosure, the diffusion method is POCl$_3$ doping. In various embodiments, POCl$_3$ doping is operated at 950° C. and for 30 minutes. Then the wafer substrate 400 anneal under 1100° C. for 2 hours. The diffusion process is a batch process which may doped a large amount of wafer in the same time. In some embodiments, the hard mask for forming the deep trench is removed after the diffusion process.

Figure 4C:
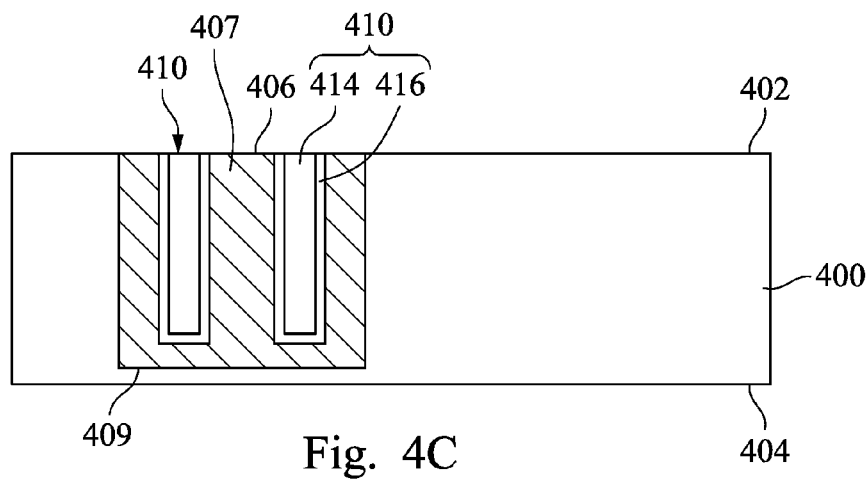

Referring to FIG. 4C, the deep trench insulator 410 is formed by filling the deep trench 408 with an insulation material. The deep trench 408 may be only filled with the insulation material or form a multilayer structure as an insulation layer 416 formed with the insulation material covering the sidewalls and the bottom surface of the deep trench, and a middle filler material 414 fill the deep trench 408, forming the deep trench insulator 401. The insulation material may be silicon oxide, and formed by CVD, PVD or thermal oxidation. In various embodiments, the insulation layer 416 may be an oxide-nitride-oxide (ONO) dielectric layer. The middle filler material 414 may be a silicon oxide, polysilicon, or even tungsten, and formed by depositing method such as CVD or PVD.

Figure 4D:
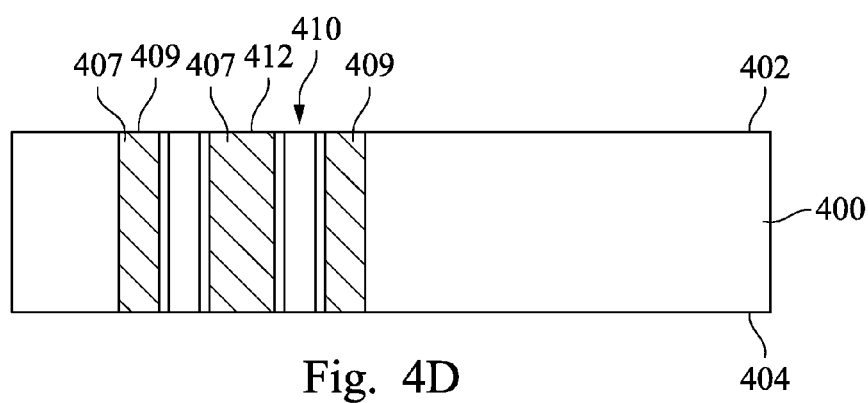

Referring to FIG. 4D, FIG. 4D shows the wafer substrate 400 in FIG. 4C after a thinning process. The wafer substrate 400 is thinned by grinding from a bottom surface 404 of the wafer substrate 400. The wafer substrate 400 is grinded until the deep trench insulator 410 is exposed. Therefore the conductive region 406 is isolated with the wafer substrate 400 by the deep trench insulator 410 to form a conductive pillar 412. The conductive pillar 412 includes the dopant 407 to become a conductor, and electrically connect the top surface 402 and the bottom surface 404 of the wafer substrate 400.

Figure 4E:
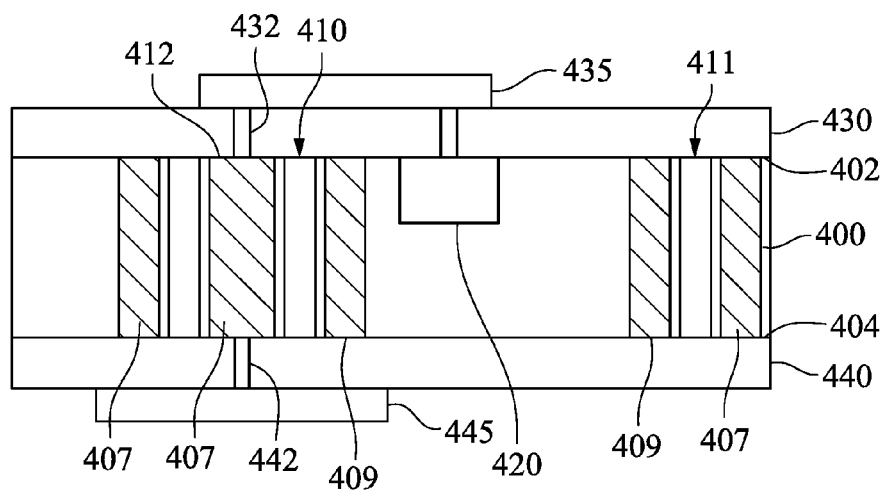

Referring to FIG. 4E, FIG. 4D shows the wafer substrate 400 in FIG. 4C further forming semiconductor devices 420 and interconnect structures before thinning the wafer substrate 400, and forming a bottom ILD layers 440, a bottom metal layers 445 and bottom contact vias 442 after thinning the wafer substrate 400, as the embodiments in the FIGS. 3D-3H. The semiconductor devices 420, for example, a complementary metal-oxide semiconductor (CMOS), are formed on the top surface 402 of the wafer substrate 400. The interconnect structure formed over the top surface 402 of the wafer substrate 400 includes a top ILD layer 430, a plurality of top contact vias 432, and a top metal layer 435. The top ILD layer 430 formed over the top surface 402 of the wafer substrate 400, covering the semiconductor devices 420 and the conductive pillar 412. The top contact vias 432 formed in the top ILD layer 430, contacting with the conductive pillar 412 and semiconductor devices 420. The top metal layer 435 formed and patterned over the top ILD layer 430, may electrically connect with the conductive pillar 412 and the semiconductor devices 420. The wafer substrate 400 is thinned form the bottom surface 404 to expose the deep trench insulator 410. The bottom ILD layer 440 formed over bottom surface 404 of the wafer substrate 400. The bottom contact vias 442 formed in the bottom ILD layer 440, contacting with the conductive pillar 412. The bottom metal layer 445 formed and patterned over the bottom ILD layer 440, is electrically connected with the conductive pillar 412. The fabricating method and material may the same with the embodiments in FIG. 3D-3H. For example, the ILD layers may include silicon oxide or BPSG, the metal layers and the contact vias may include copper or aluminum. In various embodiments of the present disclosure, a plurality of deep trench insulator may be formed in the same process. Another deep trench insulator 411 may be formed in the wafer substrate 400 and is surrounded by the doped region 409, which includes the dopant 407. An active region may be defined by the deep trench insulators 410 and 411.

Figure 5A:
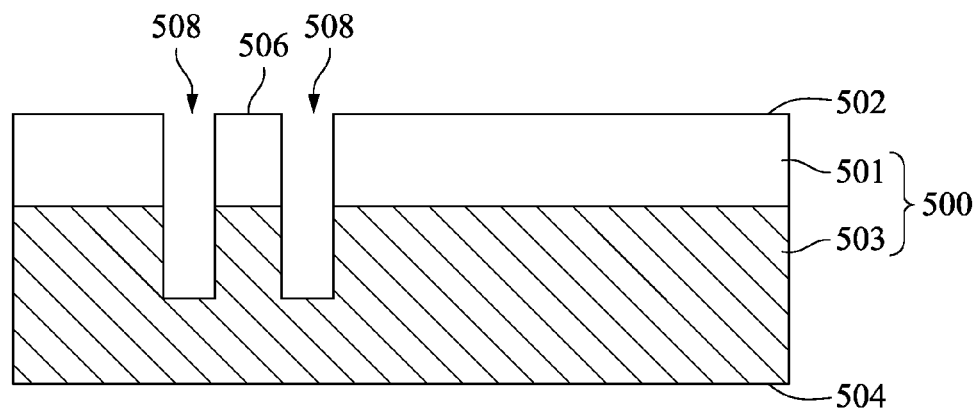
FIGS. 5A-5H are cross-sectional views at various stages of fabricating the semiconductor structure, in accordance with some embodiments.

Referring to FIGS. 5A-5H, FIGS. 5A-5H are embodiments that the wafer substrate 500 is a heavily doped wafer substrate 503 with an epi layer 501 on the wafer substrate 503. Referring to FIG. 5A, a deep trench 508 is formed from a top surface 502 of a wafer substrate 500. A conductive region 506 is defined by the deep trench 508 in the wafer substrate 500. The wafer substrate 500 may have a heavily doped wafer substrate 503 with an epi layer 501 on the wafer substrate 503. The deep trench 508 extends through the epi layer 501 and into the heavily doped wafer substrate 503. The epi layer 501 may be a lightly doped P-type or N-type (P− or N−) epi layer. The heavily doped (N++ or P++) wafer substrate 503 may include silicon, silicon-germanium, germanium, or gallium-arsenide with P-type or N-type dopants. The doped concentration may be about $10^{19}$ to about $10^{21}$ atoms/cm$^3$. In various embodiments, the wafer substrate 500 is a P– epi layer on P++ wafer substrate. In various embodiments, the wafer substrate 500 is a P– epi layer on N++ wafer substrate. The deep trench 508 may be formed by RIE. In some embodiments, the depth of the deep trench is in a range from about 75 µm to about 150 µm.

Figure 5B:
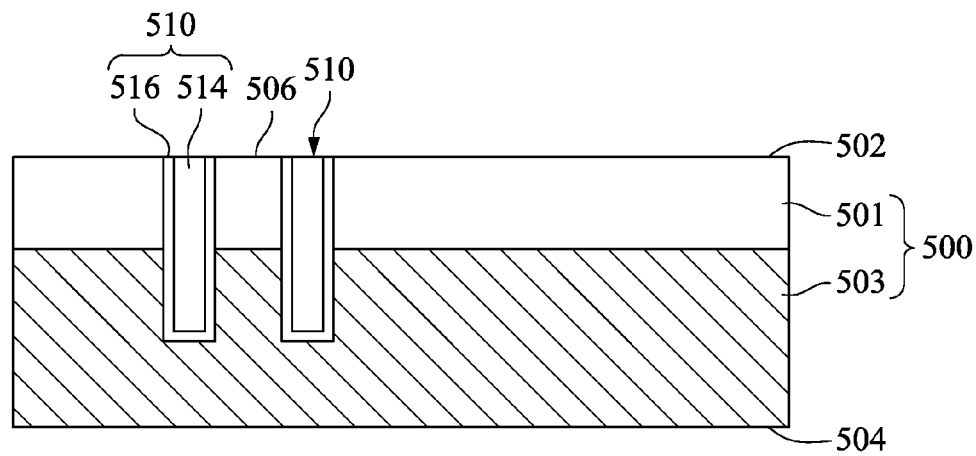

Referring to FIG. 5B, a deep trench insulator 510 is formed by filling the deep trench 508 with an insulation material. In various embodiments of the present disclosure, the deep trench insulator 510 have multilayer structure, in which an insulation layer 516 is deposited in the deep trench 508 and a middle filler material 514 is deposited over the insulation layer 516. The insulation layer 516 includes insulation material such as silicon oxide or silicon nitride and isolates the middle filler material 514 with the wafer substrate 500. The middle filler material 514 may include doped or non-doped polysilicon or silicon oxide. The insulation layer 516 may be formed by thermal oxidation or LPCVD. The filler layer may be formed by LPCVD, APCVD, PECVD, PVD, ALD or any suitable methods. And a CMP process to remove the insulator material and middle filler material on the top surface 502 of the wafer substrate 500.

Figure 5C:
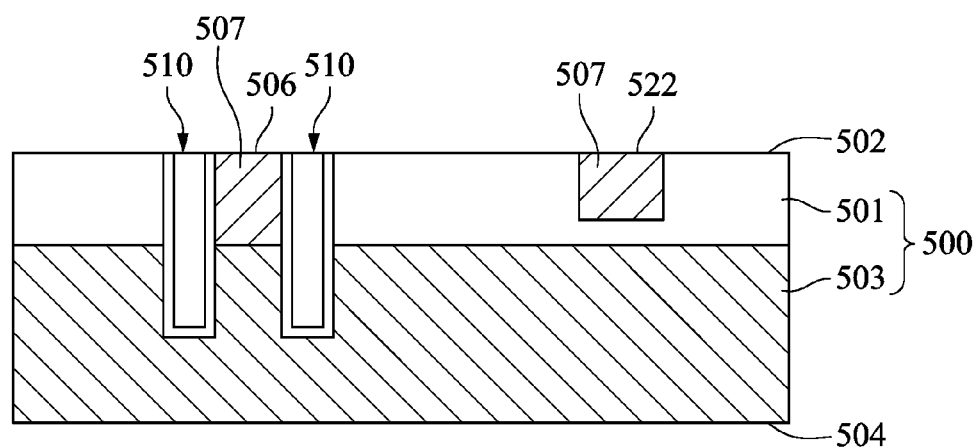

Referring to FIG. 5C, the conductive region 506 is doped with a dopant 507, and a doped area 522 is formed in the same operation. Because the wafer substrate 500 have epi layer 501 on the heavily doped wafer substrate 503, the conductive region may have different dopant concentration in the epi layer 501 and in the heavily doped wafer substrate 503. In order to make the conductive region 506 become a conductor, the epi layer 501 in the conductive region 506 need to be doped to make the dopant concentration become the same with the heavily doped wafer substrate. In various embodiments of the present disclosure, the dopant concentration in the heavily doped wafer substrate 503 is in a range about $10^{19}$ to about $10^{21}$ atoms/cm$^3$, and in the epi layer 501 is in a range from about $10^{13}$ to about $10^{15}$ atoms/cm$^3$. Therefore the epi layer 501 in the conductive region 506 may dope to $10^{21}$ atoms/cm$^3$. The doped area 522 may formed together with doping the conductive region 506. The doped area 522 may be a p-well, n-well or other region need to be doped.

Figure 5D:
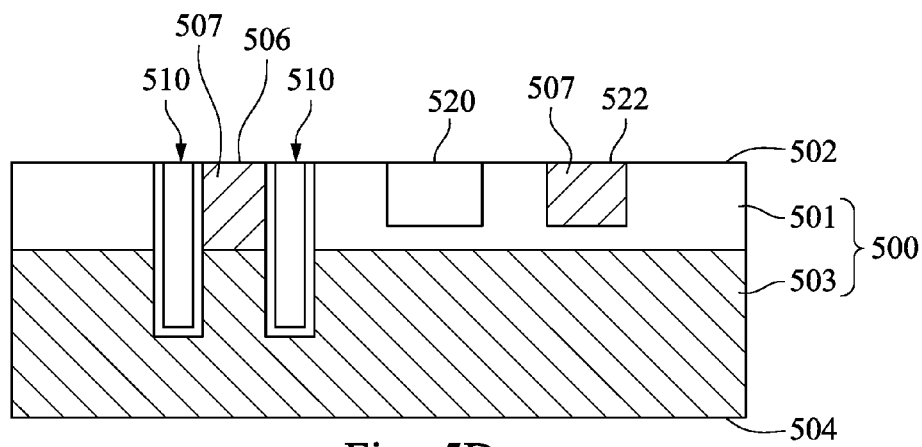

Referring to FIG. 5D, a semiconductor device 520 is formed on the top surface 502 of the wafer substrate 500. The semiconductor device 520 may be transistors, capacitors, diodes, resistors, or combinations thereof, such as CMOS. In various embodiments of the present disclosure, the conductive region 506 may be doped during or after the formation of the semiconductor device 520. The conductive region 506 may be doped together when forming the doped area 522 or forming the semiconductor device 520. For example, the conductive region 506 may be doped in the same mask of forming a core or an I/O p-wells or n-wells when forming the semiconductor devices. If doping the conductive region 506 may not doped together with any other operation during forming the semiconductor device 520, an additional mask may be added to dope the conductive region 506 after the conductive device 520 is formed. Therefore doping the conductive region 506 may operate before, during, or after forming the semiconductor devices 520 depending on the fabricating process of the semiconductor devices 520.

Figure 5E:
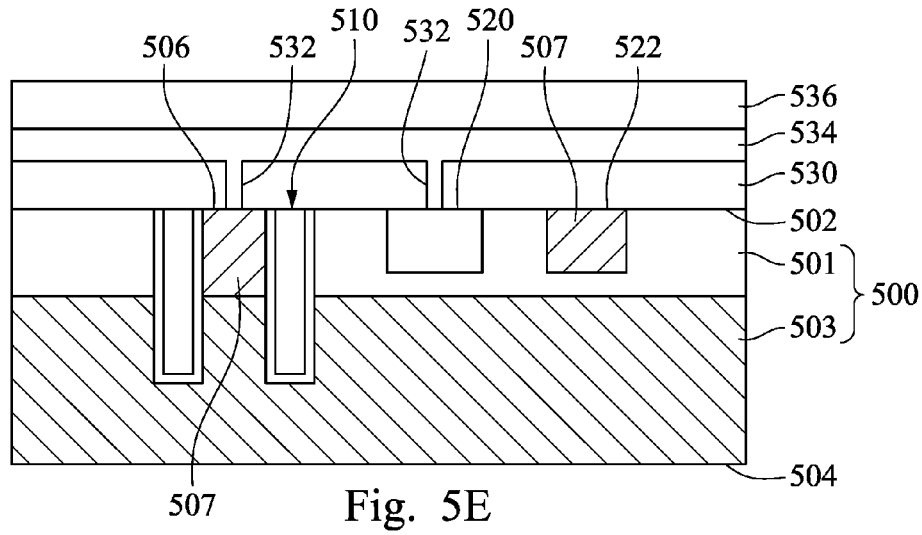

Referring to FIG. 5E, an interconnect structure formed over the top surface 502 of the wafer substrate 500 including a top ILD layer 530, a plurality of top contact vias 532, and a top metal layer 535. The top ILD layer 530 formed over the top surface 502 of the wafer substrate 500, covering the semiconductor devices 520 and conductive region 506. The top contact vias 532 formed in the top ILD layer 530, contacting with the conductive region 506 and the semiconductor devices 520. The top metal layer 534 formed over the top ILD layer 530, may electrically connect with the conductive region 506 and the semiconductor devices 520. In various embodiments, a protection layer 536 is formed over the top metal layer 534. The method and material to form the interconnect structure may be the same with above-mentioned embodiments.

Figure 5F:
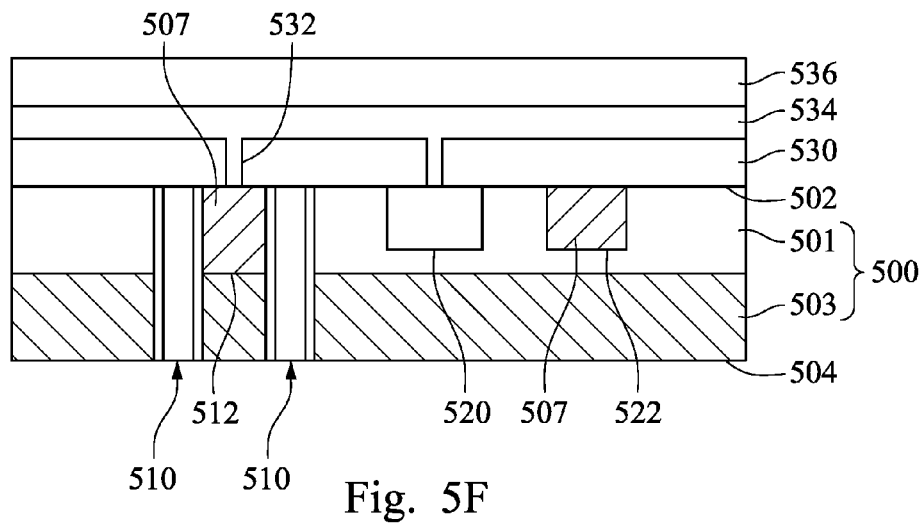

Referring to FIG. 5F, the wafer substrate 500 is thinned form the bottom surface 504 of the wafer substrate 500 to expose the deep trench insulator 510. The conductive region 506 is therefore be isolated by the deep trench insulator 510 to form a conductive pillar 512. The conductive pillar may electrically conduct the top surface 502 and the bottom surface 504 of the wafer substrate 500.

Figure 5G:
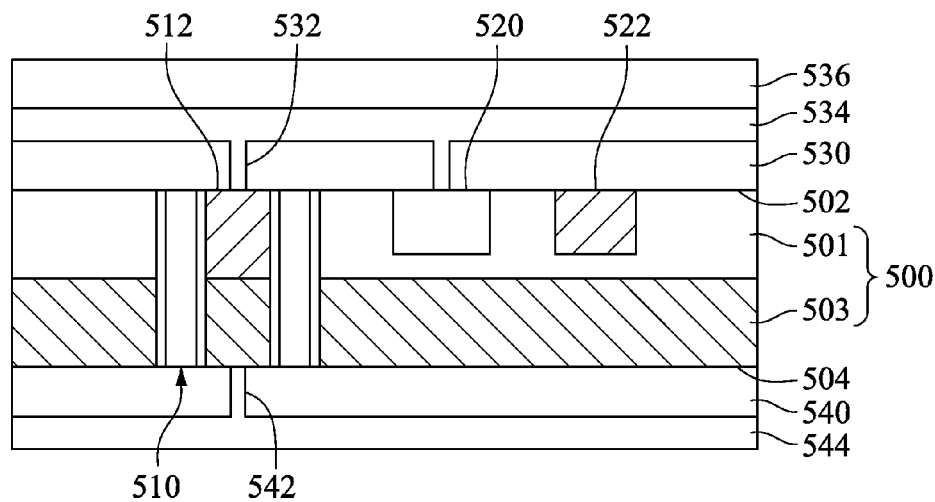

Referring to FIG. 5G, the bottom ILD layer 540 formed over bottom surface 504 of the wafer substrate 500. The bottom contact vias 542 formed in the bottom ILD layer 540, contacting with the conductive pillar 512. The bottom metal layer 544 formed and patterned over the bottom ILD layer 540, is electrically connected with the conductive pillar 512. The fabricating method and material may the same with the embodiments in FIG. 3H. For example, the bottom ILD layer 540 may include silicon oxide or BPSG, the metal layers and the contact vias may include copper or aluminum. Therefore the conductive pillar 512 and the deep trench insulator 510 surrounding the conductive pillar 512 may replace the TSVs which include tungsten or copper surrounded by oxide in a via. The conductive pillar 512 may electrically connect with the top metal layer 534 and bottom metal layer 544 without other metal material included.

Figure 5H:
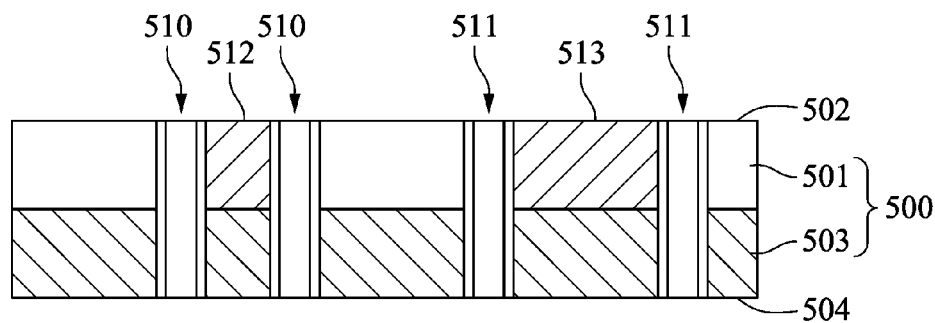

Referring to FIG. 5H, the wafer substrate 500 having a heavily doped wafer substrate 503 and an epi layer 501 formed over the wafer substrate 503. Two deep trench insulators 510, 511 formed in the wafer substrate 500 and surrounding the conductive pillars 512, 513, separately. The epi layer 501 in the conductive pillar 512 is doped with the dopant to uniform the dopant concentration in the conductive pillar 512. The embodiment shows that the conductive pillars 512, 513 may have different pillar area and formed in the same process. In comparison with TSVs formed in vias, which is harder to change the area of the TSVs. The area of the conductive pillar may affect the conductivity, which the larger area may have lower resistance. Therefore the conductivity of the conductive pillar may also be adjusted by the area of the conductive pillar.

Figure 6:
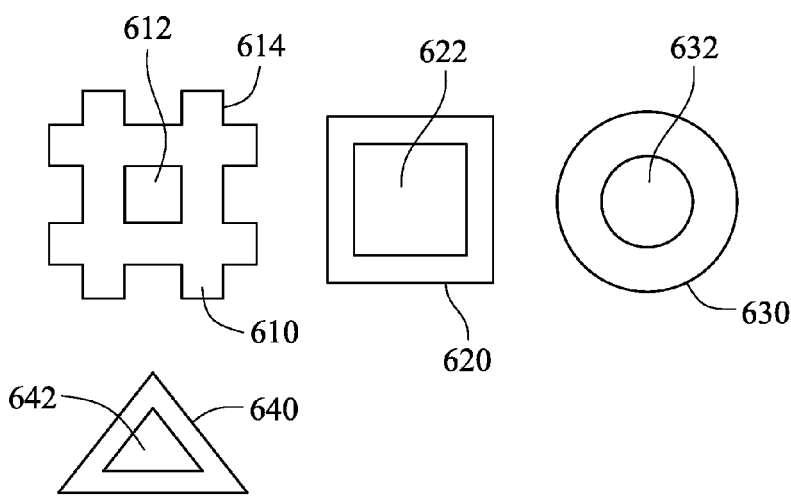
FIG. 6 is top views of the deep trench, in accordance with some embodiments.

Referring to FIG. 6, FIG. 6 shows a top view of the deep trench and the conductive region. The mask to form deep trench may have patterns of intersecting parallels 614, rectangular ring 620, circular ring 630, triangular ring 640, or polygonal ring. And the deep trench insulator may have a pattern of circular ring, triangular ring, rectangular ring, or polygonal ring. The conductive region is defined by the deep trench, therefore may have a pattern of rectangle 612, 622, circular 632, triangle 642, or polygonal. The smooth corner shape may improve stress release. The shape of the intersecting parallels 614, the protrusion part 610 may help to define the boundary of the conductive region 612 more precisely. In various embodiments of the present disclosure, the diameter of the conductive region 612 is in a range from about 3 to about 50 µm, the width of the deep trench 614 is in a range from about 1 to about 3 µm, and the protrusion part 610 may extend in a range from about 0 to about 5 µm.

The present disclosure provided a semiconductor structure and methods of fabricating the semiconductor structure. The semiconductor structure includes the conductive pillar which is isolated by the deep trench insulator and through the top and bottom surface of the wafer substrate in the wafer substrate. The conductive pillar may conduct without metal, which saves cost and simplify the process. The conductive pillar may be formed with different top view shape and area, which is beneficial to layout design and the smooth corner shape may improve stress release. Also the conductive pillar may lower the resistance in the P− epi layer on the P++ wafer substrate. The method of fabricating the semiconductor structure provides a FEOL process to form the conductive pillar in the wafer substrate. Different with forming the TSVs with tungsten or copper, which is a BEOL process. And the fabricating method may fit with different kinds of wafer substrates, no matter doped or undoped wafer substrate or wafer substrate with epi layer.

In various embodiments of the present disclosure, a semiconductor structure includes a wafer substrate having a top surface and a bottom surface; and a conductive pillar in the wafer substrate defined by a deep trench insulator through the top surface and the bottom surface of the wafer substrate.

In various embodiments of the present disclosure, a method for fabricating the semiconductor structure includes the following operations. A deep trench is formed from a top surface of a wafer substrate to define a conductive region in the wafer substrate. The conductive region is doped with a dopant. The deep trench is filled with an insulation material to form a deep trench insulator. And the wafer substrate is thinned from a bottom surface of the wafer substrate to expose the deep trench insulator and isolate the conductive region to form a conductive pillar.

In various embodiments of the present disclosure, a method for fabricating the semiconductor structure includes the following operations. A conductive region is defined in a wafer substrate by forming a deep trench from a top surface of the wafer substrate. A deep trench insulator is formed by filling the deep trench with an insulation material. The conductive region is doped with a dopant. A plurality of semiconductor devices are formed on the top surface of the wafer substrate. A top interlayer dielectric layer is deposited all over the top surface of the wafer substrate. A plurality of top contact vias are formed in the top interlayer dielectric layer and a top metal layer over the top interlayer dielectric layer, wherein the top contact vias and the top metal layer are electrically connected to the conductive region. The wafer substrate is thinned from a bottom surface of the wafer substrate to expose the deep trench insulator and isolate the conductive region to form a conductive pillar. A bottom interlayer dielectric layer is deposited over the bottom surface of the wafer substrate. And a plurality of bottom contact vias are formed in the bottom interlayer dielectric layer and a bottom metal layer over the bottom interlayer dielectric layer, wherein the bottom contact vias and the bottom metal layer are electrically connected the conductive pillar.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
 a substrate having a top surface and a bottom surface;
 a conductive pillar in the substrate defined by a deep trench insulator through the top surface and the bottom surface of the substrate;
 a plurality of semiconductor devices on the top surface of the substrate;
 a top metal layer over the top surface of the substrate; and
 a plurality of top contact vias contacting the top metal layer,
 wherein the top metal layer is electrically coupled to the conductive pillar via the top contact vias.

2. The semiconductor structure of claim 1, wherein the conductive pillar comprises a dopant.

3. The semiconductor structure of claim 1, further comprising a contact via electrically coupled to the conductive pillar.

4. The semiconductor structure of claim 1, wherein the substrate is a lightly doped substrate.

5. The semiconductor structure of claim 1, further comprising:
 a top interlayer dielectric layer over the top surface of the substrate,
 wherein the top metal layer is arranged over the top interlayer dielectric layer, and the top contact vias are arranged in the top interlayer dielectric layer.

6. The semiconductor structure of claim 1, further comprising:
 a bottom interlayer dielectric layer over the bottom surface of the substrate;
 a bottom metal layer over the bottom interlayer dielectric layer; and
 a plurality of bottom contact vias contacting the bottom metal layer in the bottom interlayer dielectric layer,
 wherein the bottom metal layer and the bottom contact vias are electrically coupled to the conductive pillar.

7. The semiconductor structure of claim 1, wherein the deep trench insulator through the top surface and the bottom surface of the substrate has a pattern of circular ring, triangular ring, rectangular ring, or polygonal ring.

8. The semiconductor structure of claim 1, wherein the deep trench insulator comprises:
 a middle filler material; and
 an insulation layer surrounding the filler material and in contact with the substrate and the conductive pillar.

9. A semiconductor structure comprising:
 a heavily doped substrate having a top surface and a bottom surface;
 an epi layer formed over the substrate;
 a conductive pillar in the substrate defined by a deep trench insulator through the top surface and the bottom surface of the substrate;
 a plurality of semiconductor devices on the top surface of the substrate;
 a top metal layer over the top surface of the heavily doped substrate; and
 a plurality of top contact vias contacting the top metal layer,
 wherein the top metal layer is electrically coupled to the conductive pillar via the top contact vias.

10. The semiconductor structure of claim 9, wherein the conductive pillar comprises a dopant.

11. The semiconductor structure of claim 9, further comprising:
a top interlayer dielectric layer over the top surface of the substrate,
wherein the top metal layer is arranged over the top interlayer dielectric layer, and the top contact vias are arranged in the top interlayer dielectric layer.

12. The semiconductor structure of claim 9, further comprising:
a bottom interlayer dielectric layer over the bottom surface of the substrate;
a bottom metal layer over the bottom interlayer dielectric layer; and
a plurality of bottom contact vias contacting the bottom metal layer in the bottom interlayer dielectric layer,
wherein the bottom metal layer and the bottom contact vias are electrically coupled to the conductive pillar.

13. The semiconductor structure of claim 9, wherein the deep trench insulator through the top surface and the bottom surface of the substrate has a pattern of circular ring, triangular ring, rectangular ring, or polygonal ring.

14. The semiconductor structure of claim 9, wherein the deep trench insulator comprises:
a middle filler material; and
an insulation layer surrounding the filler material and in contact with the substrate and the conductive pillar.

15. A semiconductor structure comprising:
a substrate;
a conductive region in the substrate defined by a deep trench insulator through the substrate, and;
a doped region around the deep trench insulator in the wafer substrate;
a plurality of semiconductor devices on a top surface of the substrate;
a top metal layer over the top surface of the substrate; and
a plurality of top contact vias contacting the top metal layer,
wherein the top metal layer is electrically coupled to the conductive region via the top contact vias.

16. The semiconductor structure of claim 15, wherein the doped region comprises a dopant from a sidewall and a bottom surface of the deep trench insulator.

17. The semiconductor structure of claim 16, wherein the conductive region comprises the dopant.

18. The semiconductor structure of claim 17, wherein the dopant in the conductive region has a concentration ranging from $10^{19}$ to $10^{21}$ atoms/cm$^3$.

19. The semiconductor structure of claim 15, wherein the deep trench insulator through the substrate has a multilayer structure.

20. The semiconductor structure of claim 19, wherein the multilayer structure comprises a middle filler material covering sidewalls and a bottom surface of the deep trench insulator, and an insulation layer surrounding the filler material and in contact with the substrate and the conductive region.

* * * * *